(12) United States Patent
Yoo (10) Patent No.: US 6,952,889 B2
(45) Date of Patent: Oct. 11, 2005

(54) FORCED CONVECTION ASSISTED RAPID THERMAL FURNACE

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 10/288,729

(22) Filed: Nov. 5, 2002

(65) Prior Publication Data

US 2004/0083621 A1 May 6, 2004

(51) Int. Cl.$^7$ .................................................. F26B 3/00
(52) U.S. Cl. ........................ 34/443; 34/107; 34/202; 432/152; 118/724; 118/725
(58) Field of Search ........................... 34/443, 467, 72, 34/107, 202; 432/152; 118/724, 725; 392/416, 418; 219/405, 390, 476, 483

(56) References Cited

U.S. PATENT DOCUMENTS

| | | | | |
|---|---|---|---|---|
| 4,232,063 A | * | 11/1980 | Rosler et al. ................ | 438/787 |
| 4,925,388 A | * | 5/1990 | Iseki et al. ..................... | 432/77 |
| 5,903,711 A | * | 5/1999 | Okase .......................... | 392/418 |
| 6,402,849 B2 | * | 6/2002 | Kwag et al. ................. | 118/745 |

FOREIGN PATENT DOCUMENTS

| | | | |
|---|---|---|---|
| JP | 60-200531 | * | 10/1985 |
| JP | 61-190948 | * | 8/1986 |
| JP | 11-150077 | * | 6/1999 |

* cited by examiner

*Primary Examiner*—Jiping Lu
(74) *Attorney, Agent, or Firm*—MacPherson Kwok Chen & Heid LLP; Tom Chen (57) ABSTRACT

An apparatus and corresponding method for heating a wafer during processing. The apparatus includes a process chamber enclosing a processing tube defining a processing area. The processing tube includes a first wall and a second wall which define a hollow cavity or passageway therebetween. The second wall includes a plurality of holes or outlets formed thereon which allow environmental communication between the hollow cavity and the processing area. The apparatus also includes a plurality of resistive heating elements positioned adjacent to the processing tube. A thermal energy output from the resistive heating elements is configured to heat a gas flowing through the hollow cavity. The gas flowing through the hollow cavity exits the hollow cavity through the plurality of holes and convectively change the temperature of the wafer disposed in the processing tube.

18 Claims, 6 Drawing Sheets

FORCED CONVECTION ASSISTED RAPID THERMAL FURNACE

BACKGROUND

1. Field of the Invention

This invention generally relates to semiconductor manufacturing equipment and, more particularly, to an apparatus and method used for the processing of semiconductor wafers.

2. Description of the Related Art

During the processing of semiconductor devices, it is highly desirable to accurately control the thermal treatment to which the devices are exposed during processing.

In the semiconductor industry, advancements in the development of semiconductor devices of decreased dimensions require the development of new processing and manufacturing techniques. One such processing technique is known as Rapid Thermal Processing (RTP). The RTP technique reduces the amount of time that a semiconductor device is exposed to high temperatures during processing. The RTP technique, typically includes irradiating the semiconductor device or wafer with sufficient power to rapidly raise the temperature of the wafer and maintaining the temperature for a time period long enough to successfully perform a fabrication process, but which avoids such problems as unwanted dopant diffusion that would otherwise occur during longer exposure to high processing temperatures.

For the above reasons, what is needed is an apparatus and method for isothermally distributing a temperature across the surface of a semiconductor device during rapid thermal processing.

SUMMARY

The present invention provides a heating apparatus and method for isothermally distributing a temperature across the surface of a semiconductor device or wafer during processing under a varying range of processing temperatures and pressures. The invention provides a potentially slip-free RTP process.

A furnace is provided including a process chamber defining a cavity, which is configured to house a processing tube. The furnace also includes a plurality of resistive heating elements advantageously arranged therein. The heating elements can be disposed across the furnace and aligned in close proximity to one another so as to provide an even heating temperature distribution. The resistive heating elements may be positioned to surround the processing tube to provide dual-sided heating during processing. Advantageously, the heating elements may be covered with a heat diffusing material, which provides uniform temperature dissipation of the heat energy provided by the resistive heating elements.

In one aspect of the invention, an apparatus is provided for heating a wafer during processing. The apparatus includes a process chamber enclosing a processing tube defining a processing area. The processing tube includes a first wall and a second wall which define a hollow cavity or passageway therebetween. The second wall includes a plurality of holes or outlets formed thereon which allow environmental communication between the hollow cavity and the processing area. The apparatus also includes a plurality of resistive heating elements positioned adjacent to the processing tube. A thermal energy output from the resistive heating elements is configured to heat a gas flowing through the hollow cavity. The gas flowing through the hollow cavity exits the hollow cavity through the plurality of holes and convectively change the temperature of the wafer disposed in the processing tube.

In another aspect of the invention, a method is provided for processing a semiconductor wafer, including flowing a gas through a hollow cavity defined by the walls of a processing tube; generating a thermal output from a plurality of resistive heating elements to change the temperature of the gas while the gas is resident in the hollow cavity; and flowing the heated gas out from the hollow cavity into a wafer processing area to change the temperature of a wafer disposed therein.

Fortunately, in the present invention rapid thermal processing can be a potentially slip-free processing technique for a wide range of temperatures and time domains, particularly near the wafer edge.

No moving parts, such as lift pins or wafer spinners, are required within the processing area to load the wafer, nor are other complex and costly components required, such as reflectors, actuators, and complex power transformers and controllers. Since the furnace does not require large lamps for heating nor moving parts, the size of the furnace, as well as the volume of the processing area, may be substantially reduced relative to other furnaces. The reduced volume and size are of particular advantage for reasons that are made apparent below.

These and other features and advantages of the present invention will be more readily apparent from the detailed description of the embodiments set forth below taken in conjunction with the accompanying drawings.

DETAILED DESCRIPTION

Figure 1:
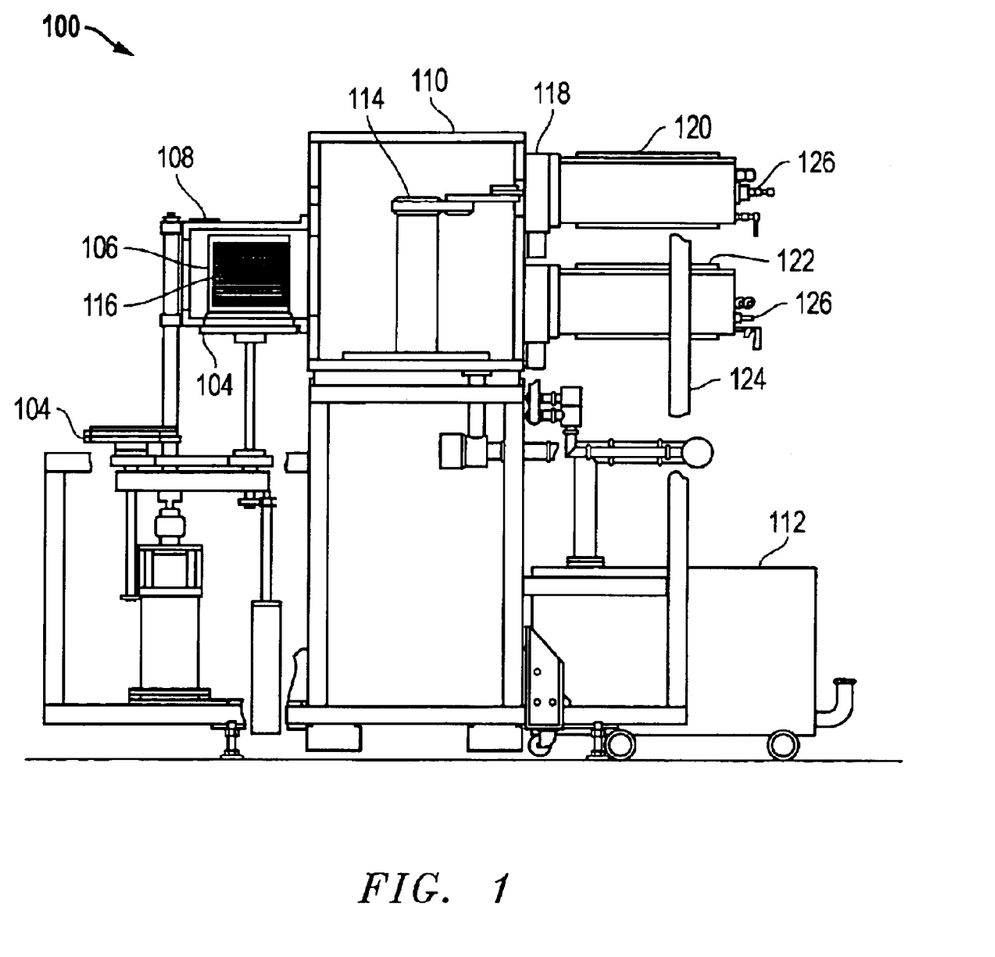
FIG. 1 is a schematic illustration of a side view of one embodiment of a semiconductor wafer processing system that establishes a representative environment of the present invention.

FIG. 1 is a schematic illustration of a side view of one embodiment of a semiconductor wafer processing system 100 that establishes a representative environment of the present invention. It should be understood that the present invention is in no way limited to use with or in any particular wafer processing system.

As shown in FIG. 1, processing system 100 includes a loading station 102 which has multiple platforms 104 for supporting and moving a wafer cassette 106 up and into a loadlock 108. Wafer cassette 106 may be a removable cassette which is loaded into a platform 104, either manually or with automated guided vehicles (AGV). Wafer cassette 106 may also be a fixed cassette, in which case wafers are loaded onto cassette 106 using conventional atmospheric robots or loaders (not shown). Once wafer cassette 106 is inside loadlock 108, loadlock 108 and transfer chamber 110 are maintained at atmospheric pressure or else are pumped down to a vacuum pressure using a pump 112. A robot 114 within transfer chamber 110 rotates toward loadlock 108 and picks up a wafer 116 from cassette 106. A furnace 120, which may also be at atmospheric pressure or under vacuum pressure, accepts wafer 116 from robot 114 through a gate valve 118.

Robot 114 then retracts and, subsequently, gate valve 118 closes to begin the processing of wafer 116. After wafer 116 is processed, gate valve 118 opens to allow robot 114 to pick-up and remove wafer 116.

Optionally, additional furnaces may be added to processing system 100, for example furnace 122. In accordance with the present invention, furnaces 120 and 122 are RTP reactors, such as those used in thermal anneals. In other embodiments, reactors 120 and 122 may also be other types of reactors, such as those used for dopant diffusion, thermal oxidation, nitridation, chemical vapor deposition, and similar processes. Reactors 120 and 122 are generally horizontally displaced, however in one embodiment, reactors 120 and 122 are vertically displaced (i.e. stacked one over another) to minimize floor space occupied by system 100.

Reactors 120 and 122 are bolted onto transfer chamber 110 and are further supported by a support frame 124. Process gases, coolant, and electrical connections may be provided through the rear end of the reactors using interfaces 126.

Figure 2:
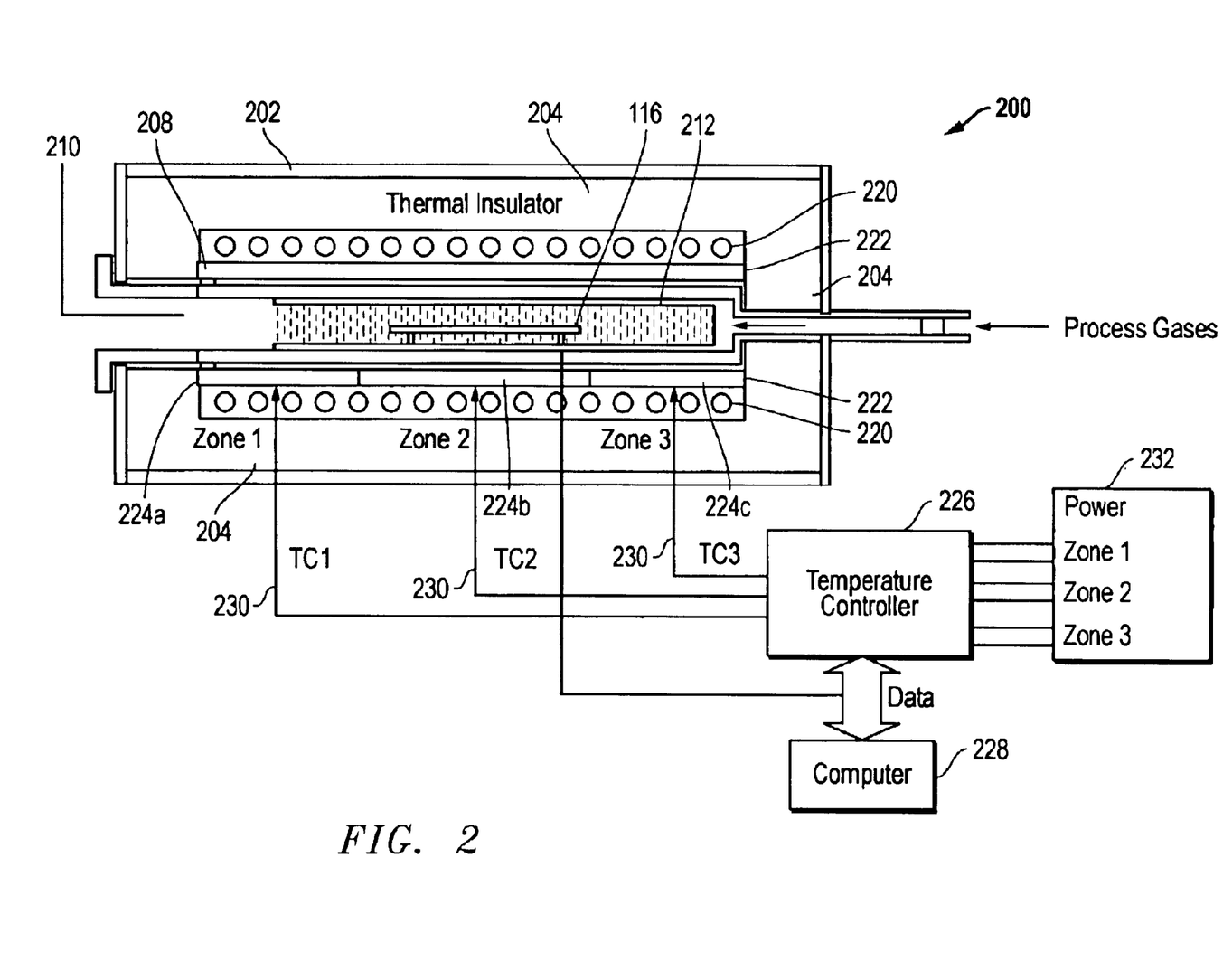
FIG. 2 is a simplified cross-sectional view of a furnace in accordance with one embodiment of the present invention.

As shown in FIG. 2, furnace 200 may generally include a closed-end processing chamber 208, which defines an interior cavity 210. Disposed within interior cavity 210 is a processing tube 212. Externally, furnace 200 may be a metallic shell 202 made of aluminum or similar metal, having an opening provided on a face of shell 202, configured to receive wafer 116 for processing. Furnace 200 may enclose a thermal insulation material, such as thermal insulation 204, which substantially surrounds processing chamber 208 so as to minimize or eliminate the escape of heat energy through shell 202. Insulation material 204 may include any suitable insulation material, such as ceramic fiber.

Optionally, to protect users and/or equipment near furnace 200, the furnace may include a detachable water cooled jacket (not shown) or similar device, which may be used to externally surround furnace 200. The water cooled jacket ensures that furnace 200 does not become too hot, so as to be a hazard to nearby equipment or personnel.

In one embodiment, a plurality of heating elements 220 are used to surround a top and a bottom portion of processing tube 212. In this embodiment, resistive heating elements 220 may be disposed in parallel across and external to process chamber 208. Each heating element 220 is in relative close proximity to each other element. For example, each resistive heating element 220 may be spaced between about 5 mm and about 50 mm, for example, between about 10 mm and about 20 mm. Accordingly, the close spacing of heating elements 220 provides for an even heating temperature distribution in processing tube 212.

Resistive heating elements 220 may include a resistive heating element core surrounded by a filament wire. The core can be made of a ceramic material, but may be made of any high temperature rated, non-conductive material. The filament wire is conventionally wrapped around the core to allow for an optimal amount of radiated heat energy to emanate from the element. The filament wire may be any suitable resistively heatable wire, which is made from a high mass material for increased thermal response and high temperature stability, such as SiC, SiC coated graphite, graphite, NiCr, AlNi and other alloys. In one embodiment, resistive heating filament wire is made of a combination Al—Ni—Fe material, known commonly as Kantal A-1 or AF, available from Omega Corp. of Stamford, Conn.

Optionally, resistive heating elements 220 may be positioned in various configurations which may include, for example, circular, zigzag, cross-hatched patterns and the like. The variable patterns may be able to provide more optimal temperature distribution and further reduce the possibility of temperature fluctuations across the surface of the wafer.

In yet another embodiment, furnace 200 includes heat diffusing members 222, which are positioned proximate to and between heating elements 220 and processing chamber 208. Heat diffusing members 222 absorb the thermal energy output from heating elements 220 and dissipate the heat evenly across process chamber 208 and tube 212. Heat diffusing members 222 may be any suitable heat diffusing material that has a sufficiently high thermal conductivity, preferably Silicon Carbide, $Al_2O_3$, or graphite.

In one embodiment, furnace 200 may include up to any number of heating zones. In the embodiment shown in FIG. 2, furnace 200 includes three parallel heating zones, which include a central zone, referenced as zone 2, and two adjacent outer zones, referenced as zones 1 and 3. Each heating element 220 can be apportioned to a specific heating zone.

As described in more detail below, each heating zone has at least one temperature sensor 224, which provides feedback to a controller 226. As fluctuations in temperature within a heating zone are sensed by the temperature sensors, real-time controller 226 can cause the power from power supply 232 to increase or decrease, as necessary, to increase or decrease the energy output (heat) from each of resistive elements 220. For example, if a drop in temperature is sensed in zone 1, the thermal energy output from resistive heating elements 220 apportioned to zone 1, increases until the temperature in zone 1 is returned to the desired level. In this manner, the temperature from zone-to-zone across the surface of wafer 116 may be kept substantially isothermal.

The number of zones and the number of resistive elements 220 apportioned to each zone may vary based on the energy output desired. The size of each zone (i.e. the heating volume) is also variable. Advantageously, the size of each zone can be scaled up or down as desired. For example, zone 2 can be scaled up for processing of larger wafers by re-apportioning heating elements 220 from zones 1 and zone 3 to zone 2. This means that the number of heating elements 220 assigned to zone 2 is increased, while the number of heating elements assigned to zones 1 and 3 is decreased. The heating elements added to zone 2 are controlled by controller 226 to respond in the same manner as the heating elements already assigned to zone 2.

In one embodiment, temperature sensors, such as thermocouples, are embedded within heat diffusing members 222. For example, thermocouples 224a, 224b and 224c can be strategically placed such that they can provide feedback via lines 230 as to the temperature conditions of heat diffusing members 222. For example, a first and a second thermocouple 224a and 224c are placed at each end of heat diffusing member 222. A third thermocouple, thermocouple 224b, is placed in the center of heat diffusing member 222. In this configuration, the temperature of a zone (e.g. zone 1, zone 2 and zone 3) can be monitored with feedback provided to controller 226. By positioning the thermocouples 224a–224c at known positions on the heat diffusing members 222, the temperature gradient can be determined with reference to a position within process chamber 208. This data is used by controller 226 to control the temperature within each zone more precisely. Thermocouples 224a, 224b and 224c can be conventional R-type or K-type thermocouples available from Omega Corporation of Stamford, Conn.

A microprocessor or process control computer 228, generally controls the processing of a semiconductor wafer placed in the RTP reactor and may be used to monitor the status of the system for diagnostic purposes. In one embodiment, process computer 228 provides control signals to controller 226 in response to temperature data received from temperature sensors 224. Process computer 228 may also direct pressure setpoints to pump assembly 112 (FIG. 1) as well as gas and plasma inlet flow signals to mass-flow controllers in a gas network (not shown). In one embodiment, controller 226 is a real-time Proportional Integral Derivative (PID), multi-zone controller, available from Omega Corporation. Controller 226 provides control signals to a SCR-based phase controlled power supply 232, which provides power to the resistive heating elements 220. Advantageously, a direct line voltage of between about 100 volts and about 500 volts may be used to power resistive heating elements 220. Thus, no complex power transformer is needed in the present invention for controlling the output of resistive heating elements 220.

In operation, the multi-zone controller 226 receives temperature sensor outputs via sensing lines 230, as well as the desired wafer temperature setpoint from computer 228 and delivers controlled power setpoints to the heating element power supply 232. Heating elements 220 increase or decrease their energy output in response to the increase or decrease in power supplied from power supply 232.

Figure 3:
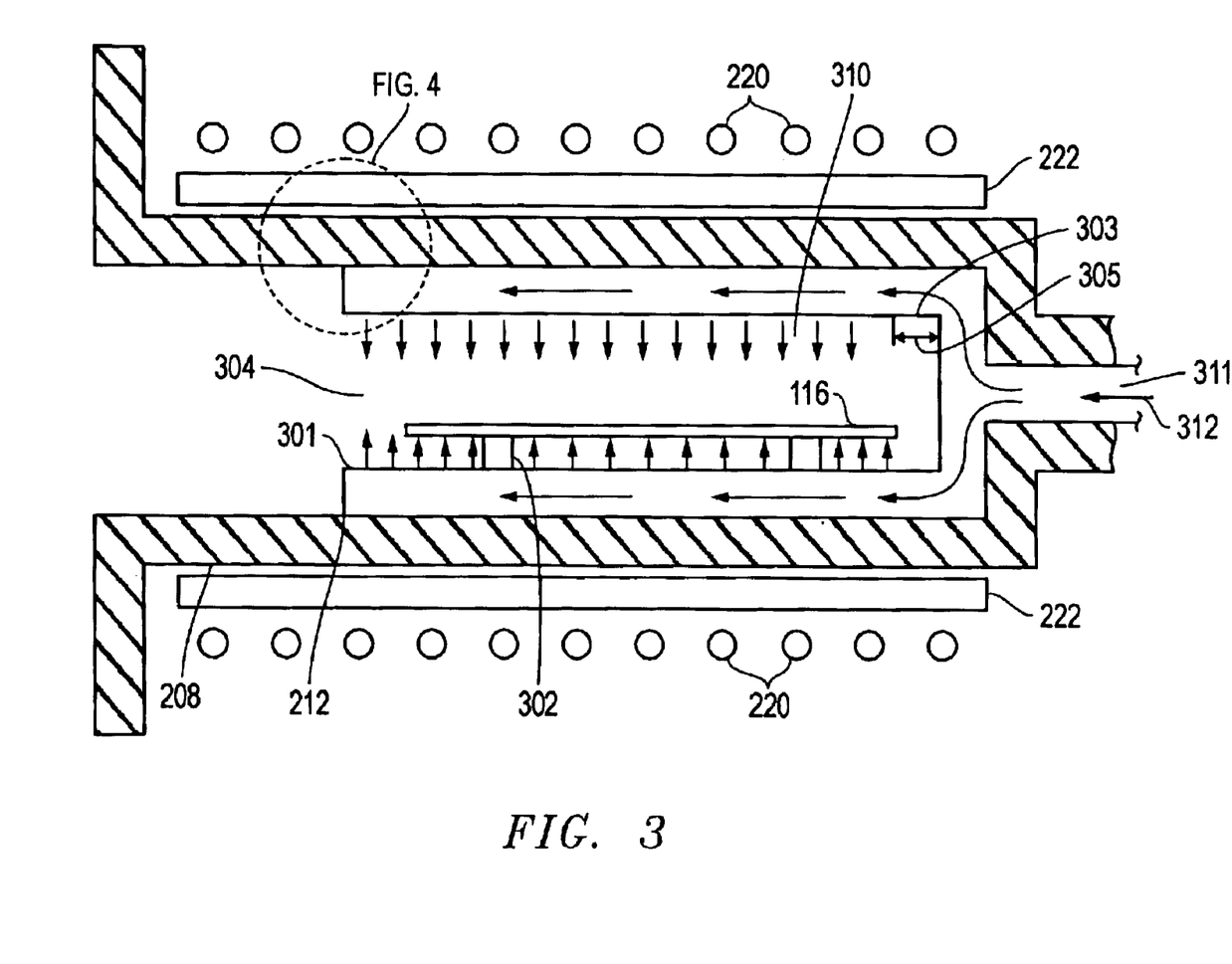
FIG. 3 is a simplified illustration of a processing chamber including a processing tube in accordance with an embodiment of the present invention.

FIG. 3 is a simplified illustration of process chamber 208 including processing tube 212 in accordance with an embodiment of the present invention. In one embodiment, processing tube 212 may be constructed with a substantially rectangular cross-section, having a minimal internal volume surrounding wafer 116. In one embodiment, the volume of processing tube 212 is usually no greater than about 5000 cm$^3$; preferably the volume is less than about 3000 cm$^3$. One result of the small volume is that uniformity in temperature is more easily maintained. Additionally, the small tube volume allows furnace 200 (FIG. 2) to be made smaller, and as a result, system 100 may be made smaller, requiring less clean room floor space. The smaller furnace size, in conjunction with the use of the robot loader, allows multiple furnaces to be used in system 100 by vertically stacking the reactors as shown in FIG. 1.

To conduct a process, processing tube 212 should be capable of being pressurized. Typically, processing tube 212 should be able to withstand internal pressures of about 0.001 Torr to 1000 Torr, preferably between about 0.1 Torr and about 760 Torr. In one embodiment, processing tube 212 can be made of quartz, but may also be made of silicon carbide, $Al_2O_3$, or other similarly suitable material.

A wafer support device 302 may be used to support a single wafer within processing tube 212. Support device 302 may be made of any high temperature resistant material, such as quartz. Support device 302 can have any height necessary, for example, a height of between about 50 μm and about 20 mm. In one embodiment, support device 302 includes standoffs positioned within processing tube 212. The standoffs will generally have a height of between about 50 μm and about 20 mm. The total contact area between the standoffs and wafer 116 can be less than about 350 mm$^2$, preferably less than about 300 mm$^2$. Standoffs 302 may be made of quartz or similar material.

An opening 304 is defined at one end of processing tube 212, which provides access to processing area 310 for the loading and unloading of wafer 116 before and after processing. Opening 304 may be a relatively small opening, but with a height and width large enough to accommodate a wafer of between about 0.5 mm to about 2 mm thick and up to about 300 mm (~12 in.) in diameter, and a robot arm of robot 114 (FIG. 1) passing therethrough. The height of opening 304 is no greater than between about 18 mm and about 50 mm, and preferably, no greater than about 30 mm. The relatively small opening helps to reduce radiation heat loss from processing tube 212. Also, the small opening keeps down the number of particles entering processing area 310 of processing tube 212 and allows for easier maintenance of the isothermal temperature environment.

Figure 4:
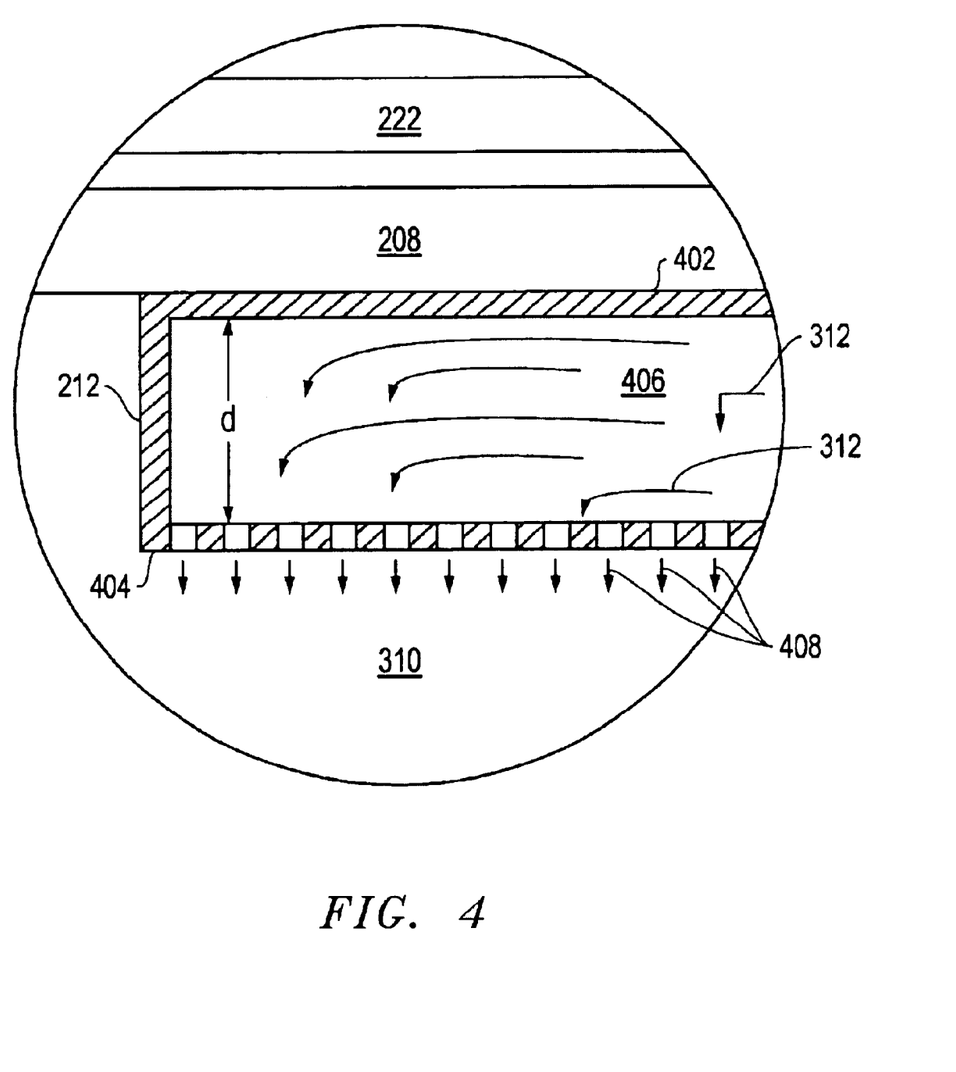
FIG. 4 is a simplified illustration of a portion of the processing tube of FIG. 3.

FIG. 4 illustrates a magnified portion of processing tube 212 in accordance with an embodiment of the present invention. As shown, processing tube 212 can be formed having a hollow wall. For example, processing tube 212 can be formed having an outer wall 402 and an inner wall 404 which enclose an internal hollow cavity or passage way 406. The thickness of outer wall 402 and inner wall 404 can be any thickness suitable to allow for high temperature processing of wafers in various pressure conditions. For example, the wall thickness can be between about 1 mm and about 5 mm. Hollow cavity 406 can also be defined with any volume necessary to facilitate wafer processing. For example, hollow cavity 406 can have a thickness d of between about 0.5 mm and about 5 mm.

Hollow cavity 406 has an inlet 311 (FIG. 3), which allows a gas to be fed from a gas reservoir (not shown) into hollow cavity 406. The gas may include, for example, any suitable carrier gas, such as He, $H_2$, $O_2$, Ar, $N_2$ and the like and any processing gas, such as $NH_3$, $O_3$, $SiH_4$, $Si_2H_6$, $B_2H_6$ and other gases suitable for CVD applications, or a combination of both gases. Hereinafter, the carrier gas, the process gas and the combination of both shall be referred to generally as "the gas."

In one embodiment, a plurality of holes or outlets 408 are formed through inner wall 404 to allow for environmental communication between hollow cavity 406 and processing area 310 (FIG. 3). Each outlet 408 can be sized to allow the various types of gases to move between hollow cavity 406 and processing area 310. In one example, outlets 408 may be between about 0.1 mm to about 2 mm in diameter.

Outlets 408 can extend from substantially end 301 of processing tube 212 at opening 304 to a point 303 a fixed distance 305 from the gas entering end of processing tube 212. Distance 305 is designed to allow the flowing gases to reach a minimum temperature at a given flow rate before exiting out from outlets 408.

Processing tube 212 can be fabricated using many well known fabrication techniques. For example, processing tube 212 may be welded, braised, assembled or cast.

Heat transferred to the flowing gas is a function of the thermal mass of the heater, the flow rate of the gas and the diameter of the outlets, as well as the type of gas, the residence time of the gas in hollow cavity 406 and the nominal temperature of hollow cavity 406. Each of these parameters can be adjusted until the exiting gas temperature is appropriate for a specific process.

Generally, the thermal mass and thermal energy output and capacity of the heating elements will be known. Accordingly, for a given thermal energy output the gas can be made to flow through hollow cavity 406 at any desired rate, for example, between about 10 sccm to about 100 slm. The flow rate of gases is selected to ensure that the wafer remains stable upon the standoffs and that the pressure difference between the ambient environment outside of the processing tube and inside the processing tube is relatively small.

Hollow cavity 406 provides for heat exchange, such that the gas can be heated as it travels from inlet 311 through to the exit points of outlets 408. The gas entering inlet 311 can be at ambient temperature or may be pre-heated prior to entering hollow cavity 406. Before the gas exits outlets 408, the gas is made to flow through a distance 305 of hollow cavity 406. The length of distance 305 is variable, but is at least long enough to provide the residence time for the gas to reach a desired minimum temperature before exiting outlets 408 into processing area 310.

In one embodiment, the gas is made to move through hollow cavity 406 at a flow rate which allows the gas to be heated at a rate of between about 1° C./s and about 1000° C./s. to between approximately 100° C. and 1400° C.

As shown in FIG. 3, in one operational embodiment, wafer 116 is placed within processing tube 212 on standoffs 302. A gas, such as a carrier gas combined with process gases, is allowed to flow through hollow cavity 406. In one embodiment, the gas entering hollow cavity 406 can be pre-heated or, alternatively, can be at ambient temperature. In this example, the gas enters hollow cavity 406 as indicted by arrows 312 at approximately room temperature (~25° C.). However, in either embodiment, the gas is heated to a processing temperature from heat transferred from heating elements 220 into heat diffusion material 222 and into process chamber 208 and finally, through outer wall 402 and inner wall 404. Initially, the gas flows a distance 305 within hollow cavity 406 to reach a minimum desired processing temperature. The flowing gas then reaches outlets 408 to enter processing area 310. The flowing gas contacts wafer 116 in processing area 310 to heat wafer 116 using the effect of forced convection.

The heated gas flows into hollow cavity 406 at a controlled rate. Thus, the ramp rate control for heating wafer 116 can be correlated to gas flow rate control. As described in detail below, the gas flow can be continuous through the processing of wafer 116, pulsed, flown during temperature ramp up only, or flown during cool down, or a combination of both.

Figure 5:
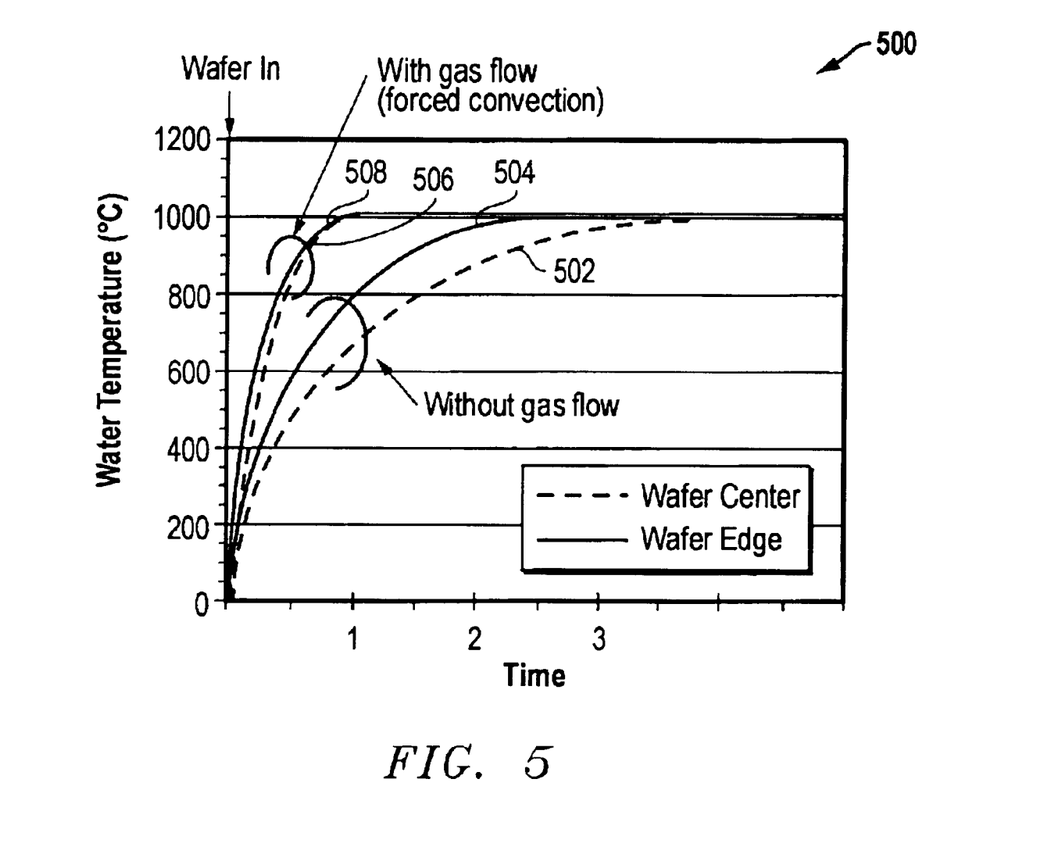
FIG. 5 is a graph illustrating the effect of the present invention on wafer heating.

As illustrated in graph 500 of FIG. 5, wafers placed in furnace 200 and heated have different heating profiles and heating rates between a center portion and an edge portion of the wafer. For example, without gas flow through hollow cavity 406 of processing tube 212, the wafer center 502 requires approximately 3.5 time units to reach a processing temperature of about 1000° C. The edge of the wafer requires about 2.5 time units to reach the same temperature.

A wafer heated using forced convection assistance in accordance with the present invention, created by flowing gas through hollow cavity 406 and into processing area 310, is heated at a center portion and an edge portion of the wafer with almost identical heating profiles. For example, the wafer center 506 and the wafer edge 508 reach the processing temperature of about 1000° C. at about the same time, in less than 1 time unit.

A primary advantage of the present invention is the ability to conduct substantially slip-free RTP of a silicon wafer with lesser emissivity dependence and lesser pattern induced local heating effect. Further, by controlling ramp rate control using gas flow rate control, the wafer can be heated rapidly and uniformly as illustrated in FIG. 5.

Figure 6:
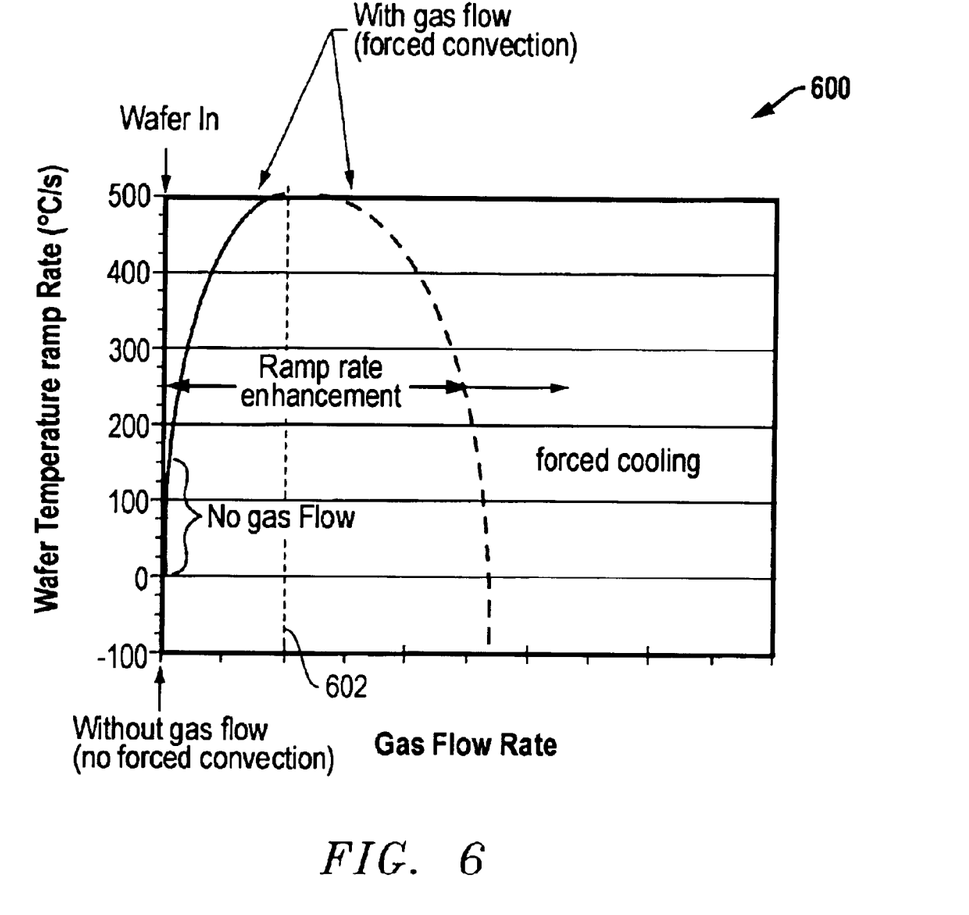
FIG. 6 is a graph illustrating the effect of the present invention on wafer cooling.

FIG. 6 illustrates the effect of another embodiment of the present invention in which forced convection enables forced cooling of the wafer while the wafer is within processing tube 212. As shown in graph 600, as the flow rate of gas through hollow cavity 406 (FIG. 4) is increased, the wafer temperature ramp rate is increased. However, at a given thermal output and with a particular gas flow rate, as indicated at 602, the wafer temperature ramp rate begins to decrease. At this juncture, the effect of the forced convection is to remove energy from the wafer causing the wafer to cool. The forced cooling reduces the post-processed wafer to a temperature below the critical slip formation temperature without requiring the cooling of the entire process chamber 208 or requiring a separate cooling chamber.

It should be understood that the wafer described above may be made of conventional materials commonly used in the industry, such as silicon, gallium arsenide, or other similar compound or the wafer may be a semiconductor wafer, made from quartz or glass.

Having thus described the preferred embodiments, persons skilled in the art will recognize that changes may be made in form and detail without departing from the spirit and scope of the invention. Thus the invention is limited only by the following claims.

What is claimed is:

1. An apparatus for heating a wafer during processing, the apparatus comprising:
   a process chamber;
   a processing tube defining a processing area disposed in said process chamber, said processing tube having a first wall and a second wall defining a hollow cavity therebetween, said second wall including a plurality of holes formed thereon which allow environmental communication between said hollow cavity and said processing area, wherein said wafer is disposed between opposing second walls, said holes configured such that a centerline of each of said plurality of holes aligns perpendicularly and incident to both a front side and a back side of a wafer disposed in said processing area; and
   a plurality of resistive heating elements positioned adjacent to said processing tube, a thermal energy output from said resistive heating elements configured to heat a gas flowing through said hollow cavity,
   said gas flowing through said hollow cavity exits said hollow cavity through said plurality of holes to convectively change the temperature of said wafer disposed in said processing area.

2. The apparatus of claim 1, wherein said gas flowing trough said hollow cavity which exits said hollow cavity through said plurality of holes convectively increases the temperature of said wafer disposed in said processing tube.

3. The apparatus of claim 1, wherein said gas flowing trough said hollow cavity which exits said hollow cavity through said plurality of holes convectively decreases the temperature of said wafer disposed in said processing tube.

4. The apparatus of claim 1, wherein said processing tube comprises a material selected from the group consisting of quartz, $Al_2O_3$, and silicon carbide.

5. The apparatus of claim 1, wherein said processing tube is configured to be void of internal moving parts.

6. The apparatus of claim 1, wherein said gas comprises a gas taken from the group consisting of He, $H_2$, $O_2$, Ar, $N_2$, NH$_3$, O$_3$, SiH$_4$, Si$_2$H$_6$, B$_2$H$_6$ and other gases suitable for CVD applications and combinations thereof.

7. The apparatus of claim 1, wherein the thermal energy output of each of said resistive heating elements is controllable using a controller.

8. The apparatus of claim 1, wherein said gas flows through said hollow cavity at a rate of between about 10 sccm to about 100 slm.

9. The apparatus of claim 1, wherein said change of temperature occurs at a rate of between about 1° C./s and about 1000° C./s.

10. The apparatus of claim 1, wherein said temperature of said wafer can be changed between about 100° C. and about 1400° C.

11. The apparatus of claim 1, wherein said pressure within said processing tube can range from between about 0.01 Torr and about 1000 Torr.

12. The apparatus of claim 1, wherein said process chamber defines a plurality of heating zones, wherein each of said plurality of heating zones comprises at least one of said plurality of resistive heating elements.

13. The apparatus of claim 12, wherein each of said plurality of heating zones comprises a temperature measuring device configured to send feedback information to a microprocessor.

14. The apparatus of claim 1, further comprising a heat diffusing material proximate to said plurality of heat resistive elements, said heat diffusing material causing said thermal energy output from each of said resistive heating elements to heat said gas flowing in said hallow cavity.

15. A method for processing a semiconductor wafer comprising:

flowing a gas through a cavity defined by the hollow walls of a processing tube;

generating a thermal output from a plurality of resistive heating elements to change the temperature of said gas while said gas is resident in said cavity; and flowing said heated gas out from said cavity into a wafer processing area in a direction substantially perpendicular and incident to both a front side and a back side of a wafer disposed in said wafer processing area to change the temperature of said wafer.

16. The method of claim 15, wherein said flowing said heated gas out from said hollow cavity into a wafer processing area to change the temperature of a wafer disposed therein increases the temperature of said wafer disposed in said processing tube.

17. The method of claim 15, wherein said flowing said heated gas out from said hollow cavity into a wafer processing area to change the temperature of a wafer disposed therein decreases the temperature of said wafer disposed in said processing tube.

18. The method of claim 15, wherein said processing tube comprises a material selected from the group consisting of metals, quartz, Al$_2$O$_3$, and silicon carbide.

* * * * *

UNITED STATES PATENT AND TRADEMARK OFFICE
CERTIFICATE OF CORRECTION

PATENT NO. : 6,952,889 B2  Page 1 of 1
APPLICATION NO. : 10/288729
DATED : October 11, 2005
INVENTOR(S) : Woo Sik Yoo It is certified that error appears in the above-identified patent and that said Letters Patent is hereby corrected as shown below:

Column 8, line 54, delete "trough" and insert --through--

Column 8, line 58, delete "trough" and insert --through--

Column 9, line 30, delete "hallow" and insert --hollow--

Signed and Sealed this

Twenty-first Day of November, 2006

JON W. DUDAS
*Director of the United States Patent and Trademark Office*